(12) United States Patent
Luo et al.

(10) Patent No.: US 11,974,698 B2
(45) Date of Patent: May 7, 2024

(54) FOOD PROCESSOR, AND POWER SUPPLY BOARD ASSEMBLY AND BASE FOR FOOD PROCESSOR

(71) Applicant: GUANGDONG MIDEA CONSUMER ELECTRIC MANUFACTURING CO., LTD., Foshan (CN)

(72) Inventors: Guohua Luo, Foshan (CN); Qian Fan, Foshan (CN); Yunxiang Liu, Foshan (CN)

(73) Assignee: GUANGDONG MIDEA CONSUMER ELECTRIC MANUFACTURING CO., LTD., Foshan (CN)

( * ) Notice: Subject to any disclaimer, the term of this patent is extended or adjusted under 35 U.S.C. 154(b) by 919 days.

(21) Appl. No.: 16/977,052

(22) PCT Filed: Aug. 3, 2018

(86) PCT No.: PCT/CN2018/098626
§ 371 (c)(1),
(2) Date: Aug. 31, 2020

(87) PCT Pub. No.: WO2019/169829
PCT Pub. Date: Sep. 12, 2019

(65) Prior Publication Data
US 2020/0397190 A1 Dec. 24, 2020

(30) Foreign Application Priority Data

Mar. 7, 2018 (CN) .......................... 201810186153.8
Mar. 7, 2018 (CN) .......................... 201810187843.5
(Continued)

(51) Int. Cl.
*A47J 43/08* (2006.01)
*A23N 1/02* (2006.01)
(Continued)

(52) U.S. Cl.
CPC .............. *A47J 43/085* (2013.01); *A23N 1/02* (2013.01); *H02K 11/33* (2016.01); *H02K 21/16* (2013.01);
(Continued)

(58) Field of Classification Search
USPC ........................................................... 99/510
See application file for complete search history.

(56) References Cited

U.S. PATENT DOCUMENTS

2004/0242078 A1 12/2004 Brovald et al.
2012/0205475 A1 8/2012 Wu
2013/0286606 A1 10/2013 Watanabe et al.

FOREIGN PATENT DOCUMENTS

CN 2347417 Y 11/1999
CN 1298568 A 6/2001
(Continued)

OTHER PUBLICATIONS

International Search Report of PCT/CN2018/098626.
(Continued)

*Primary Examiner* — Vy T Nguyen

(57) ABSTRACT

A food processor, and a power supply board assembly and a base for a food processor. The power supply board assembly includes: a mounting bracket; a power supply board and a filter board, and the power supply board and the filter board are mounted at two opposite sides of the mounting bracket respectively, and the power supply board and the filter board are electrically connected with wires.

6 Claims, 11 Drawing Sheets

(30) Foreign Application Priority Data

Mar. 7, 2018 (CN) .......................... 201820315669.3
Mar. 7, 2018 (CN) .......................... 201820316117.4

(51) Int. Cl.
*H02K 11/33* (2016.01)
*H02K 21/16* (2006.01)
*H05K 7/14* (2006.01)

(52) U.S. Cl.
CPC ....... *H05K 7/1458* (2013.01); *H02K 2211/03* (2013.01); *H02K 2213/03* (2013.01)

(56) References Cited

FOREIGN PATENT DOCUMENTS

| | | | |
|---|---|---|---|
| CN | 2655779 | Y | 11/2004 |
| CN | 2749412 | Y | 1/2006 |
| CN | 2756137 | Y | 2/2006 |
| CN | 201066971 | Y | 5/2008 |
| CN | 101350509 | A | 1/2009 |
| CN | 101414205 | A | 4/2009 |
| CN | 102142211 | A | 8/2011 |
| CN | 202044117 | U | 11/2011 |
| CN | 202069450 | U | 12/2011 |
| CN | 202154570 | U | 3/2012 |
| CN | 202282933 | U | 6/2012 |
| CN | 202537115 | U | 11/2012 |
| CN | 202772677 | U | 3/2013 |
| CN | 103376756 | U | 10/2013 |
| CN | 203263146 | U | 11/2013 |
| CN | 203407135 | U | 1/2014 |
| CN | 203704063 | U | 7/2014 |
| CN | 103974583 | A | 8/2014 |
| CN | 104079119 | A | 10/2014 |
| CN | 204928523 | U | 12/2015 |
| CN | 204995219 | U | 1/2016 |
| CN | 204995289 | U | 1/2016 |
| CN | 105409105 | A | 3/2016 |
| CN | 205118234 | U | 3/2016 |
| CN | 205458234 | U | 8/2016 |
| CN | 106026465 | A | 10/2016 |
| CN | 205648344 | U | 10/2016 |
| CN | 106097891 | A | 11/2016 |
| CN | 205697252 | * | 11/2016 |
| CN | 205697252 | U | 11/2016 |
| CN | 205866652 | U | 1/2017 |
| CN | 106409621 | A | 2/2017 |
| CN | 106510495 | A | 3/2017 |
| CN | 106580130 | A | 4/2017 |
| CN | 206371959 | * | 8/2017 |
| CN | 206371959 | U | 8/2017 |
| CN | 107307723 | A | 11/2017 |
| CN | 107518781 | A | 12/2017 |
| CN | 107528400 | A | 12/2017 |
| CN | 208079597 | U | 11/2018 |
| DE | 20020121 | U1 | 3/2001 |
| JP | 2004327700 | A | 11/2004 |
| JP | 2009301810 | A | 12/2009 |
| JP | 2013229414 | A | 11/2013 |
| JP | 2014192515 | A | 10/2014 |
| WO | WO 2018195039 | * | 10/2018 |

OTHER PUBLICATIONS

The first OA for Chinese Application No. 201810187843.5.
OA for JP application 2020-541592.
Third OA for CN application 201810187843.5.
Office Action dated Oct. 15, 2021 for CN application 201810186153.8.
OA for CN application 201810186153.8.
OA for EP application 18909018.6.

* cited by examiner

FOOD PROCESSOR, AND POWER SUPPLY BOARD ASSEMBLY AND BASE FOR FOOD PROCESSOR

CROSS-REFERENCES TO RELATED APPLICATIONS

This application is a national phase application of International Application No. PCT/CN2018/098626, filed on Aug. 3, 2018, which claims priority to Chinese Patent Application Serial No. 201820315669.3, No. 201810187843.5, No. 201810186153.8 and No. 201820316117.4, filed in the Chinese Patent Office on Mar. 7, 2018, the entireties of which are herein incorporated by reference.

FIELD

The present disclosure relates to the field of food processor technologies, and more particularly to a food processor, and a power supply board assembly and a base for a food processor.

BACKGROUND

In a related art, for a food processor such as a high speed blender, or the like, a power supply board and a filter board thereof (such as an EMC plate) are mounted in a casing by two mounting brackets respectively, which leads to relatively large occupied spaces for the power supply board and the filter board, does not contribute to miniaturization of the food processor, increases manufacturing costs, also tends to cause a messy wiring between the power supply board and the filter board, and increases a difficulty in maintenance.

SUMMARY

The present disclosure seeks to solve at least one of the problems existing in the related art to at least some extent. To this end, the present disclosure proposes a power supply board assembly for a food processor, with a simple structure, a small occupied space, and easy wiring.

The present disclosure further proposes a base having the above-mentioned power supply board assembly for a food processor.

The present disclosure further proposes a food processor having the above-mentioned base for a food processor.

The present disclosure also proposes a food processor having the above-mentioned power supply board assembly for a food processor.

The power supply board assembly for a food processor according to an embodiment of a first aspect of the present disclosure includes a mounting bracket, a power supply board, and a filter board, in which the power supply board and the filter board are mounted at two opposite sides of the mounting bracket respectively, and the power supply board and the filter board are electrically connected with an electric wire.

In the power supply board assembly for a food processor according to the embodiment of the present disclosure, by providing the mounting bracket, and mounting the power supply board and the filter board at two opposite sides of the mounting bracket respectively, the number of mounting components may be decreased, the occupied space of the power supply board assembly is reduced, the wiring between the power supply board and the filter board may also be simplified, and the difficulty in maintenance is lowered.

In addition, the power supply board assembly for a food processor according to the above-mentioned embodiment of the present disclosure may also have the following additional embodiments.

In the power supply board assembly for a food processor according to an embodiment of the present disclosure, the power supply board is fixed to the mounting bracket by at least one of a threaded fastener and a snap-fit structure; and/or the filter board is fixed to the mounting bracket by at least one of the threaded fastener and the snap-fit structure.

In some examples of the present disclosure, the mounting bracket is provided with a plurality of first hooks and a plurality of second hooks, and the plurality of first hooks are snapped with the power supply board, and the plurality of second hooks are snapped with the filter board.

In some examples of the present disclosure, the mounting bracket includes two pairs of opposite ends, the plurality of first hooks are provided at one of the two pairs of opposite ends of the mounting bracket and each end is provided with at least one first hook to snap the two opposite ends of the power supply board to the mounting bracket, and the plurality of second hooks are provided at the other one of the two pairs of opposite ends of the mounting bracket and each end is provided with at least one second hook to snap the filter board to the mounting bracket.

In some examples of the present disclosure, at least one of the first hook and the second hook includes: an arm portion having a first end connected to the mounting bracket; a hook portion provided at a second end of the arm portion, protruding from a side surface of the arm portion and stopping the power supply board or the filter board when the power supply board or the filter board is mounted to the mounting bracket.

In some examples of the present disclosure, the arm portion is formed into a plate shape, and a reinforcing structure is provided at a junction between the arm portion and the mounting bracket.

In some examples of the present disclosure, a side surface of the mounting bracket facing the power supply board is provided with a protruding first support structure, and the power supply board is supported by the first support structure; and/or a side surface of the mounting bracket facing the filter board is provided with a protruding second support structure, and the filter board is supported by the second support structure.

In some examples of the present disclosure, at least one of the first and second support structures includes: a plurality of edge support portions, spaced apart in a circumferential direction of the mounting bracket, and supporting an edge of the power supply board or the filter board; and/or a plurality of middle support portions for supporting a middle of the power supply board or the filter board.

In some examples of the present disclosure, the edge support portion includes: a support plate provided adjacent to the first hook or the second hook, the support plate being formed into a U shape substantially, and the first hook or the second hook being provided at an opening of the U shape of the support plate.

In some embodiments of the present disclosure, at least one end of the mounting bracket is provided with a wire passing hole penetrating through the mounting bracket and configured to allow an electric wire to pass through.

In some examples of the present disclosure, the electric wire connecting the power supply board and the filter board passes through the wire passing hole.

In some examples of the present disclosure, the wire passing hole is configured as an opening structure extending to an edge of the mounting bracket, and a wire clamping structure for clamping wire harness is provided at the wire passing hole.

In some examples of the present disclosure, the wire clamping structure includes: a wire clamping plate having a first end connected with the edge of the mounting bracket, the wire passing hole being defined by the wire clamping plate and the edge of the mounting bracket; and a clamping projection provided at an inner surface of the wire clamping plate facing the edge of the mounting bracket and disposed adjacent to a second end of the wire clamping plate.

In some examples of the present disclosure, edges of the power supply board and the filter board are provided with fixing holes for the threaded fasteners respectively.

In a base for a food processor according to an embodiment of the second aspect of the present disclosure, a processing container of the food processor is adapted to be detachably disposed at the base, and the base includes: a housing having a mounting cavity defined therein; a power assembly provided in the mounting cavity and being in transmission connection with a food processing member extending into the processing container when the processing container is provided at the base, to drive the food processing member to rotate relative to the processing container; a coupler mounted at an upper portion of the housing, located behind and above the power assembly, and coupled with the processing container when the processing container is placed at the base; and a power supply board assembly according to the embodiment of the first aspect of the present disclosure, the power supply board assembly being provided in the mounting cavity, electrically connected with the power assembly, and staggered with the coupler in a horizontal direction.

Further, a vertical projection of the power supply board assembly does not overlap a vertical projection of the coupler.

The base for a food processor according to an embodiment of the present disclosure further includes: a capacitive component provided in the mounting cavity and remote from the power supply board assembly.

Further, the capacitive component and the power supply board assembly are provided at two sides of the power assembly respectively.

According to some embodiments of the present disclosure, the base is provided with a display assembly configured to display an operating state of the food processor, and the power supply board assembly is electrically connected with the display assembly and is provided below the display assembly.

Further, the display assembly is provided at a front side of the base.

In some embodiments of the present disclosure, the food processing member is configured as a knife assembly, and the power assembly includes an electric motor and a fan wheel provided at a lower portion of the electric motor.

In some embodiments of the present disclosure, the power assembly includes an electric motor, and a stator core of the electric motor includes: a ring-shaped stator yoke having a width of W; and a plurality of stator teeth provided at an inner peripheral face of the stator yoke, two adjacent stator teeth defining a stator slot therebetween, the plurality of the stator teeth defining a stator hole coaxial with the stator yoke, and each of the stator teeth includes a stator tooth body connected to the stator yoke and a stator tooth shoe provided at an inner end of the stator tooth body, and a width of each of the stator tooth bodies is V, and W:V=0.6–0.7.

In some embodiments of the present disclosure, the power assembly includes an electric motor, and a stator core of the electric motor includes: a ring-shaped stator yoke; and a plurality of stator teeth provided at an inner peripheral face of the stator yoke; two adjacent stator teeth defining a stator slot therebetween, the plurality of the stator teeth defining a stator hole coaxial with the stator yoke; a rotor core being rotatably provided in the stator hole and coaxial with the stator hole, the rotor core having a maximum radial dimension d, the stator yoke having a maximum radial dimension D; and 0.4≤d/D≤0.55.

According to some embodiments of the present disclosure, the power assembly includes an electric motor, and the electric motor is a variable frequency brushless electric motor.

A food processor according to an embodiment of a third aspect of the present disclosure includes a base according to an embodiment of the second aspect of the present disclosure.

The food processor according to an embodiment of the third aspect of the present disclosure includes a processing container defining a food accommodating cavity configured to contain food; a power assembly; a food processing member configured to process food, extending into the food accommodating cavity, and configured to rotate relative to the processing container under driving of the power assembly; and a power supply board assembly according to the embodiment of the first aspect of the present disclosure, the power supply board being electrically connected with the power assembly.

In some embodiments of the present disclosure, the power assembly includes an electric motor, and a stator core of the electric motor includes: a ring-shaped stator yoke having a width of W; and a plurality of stator teeth provided at an inner peripheral face of the stator yoke, two adjacent stator teeth defining a stator slot therebetween, the plurality of the stator teeth defining a stator hole coaxial with the stator yoke, and each of the stator teeth includes a stator tooth body connected to the stator yoke and a stator tooth shoe provided at an inner end of the stator tooth body, and a width of each of the stator tooth bodies is V, and W:V=0.6–0.7.

In some embodiments of the present disclosure, the power assembly includes an electric motor, and a stator core of the electric motor includes: a ring-shaped stator yoke; and a plurality of stator teeth provided at an inner peripheral face of the stator yoke; two adjacent stator teeth defining a stator slot therebetween, the plurality of the stator teeth defining a stator hole coaxial with the stator yoke; a rotor core being rotatably provided in the stator hole and coaxial with the stator hole, the rotor core having a maximum radial dimension d, the stator yoke having a maximum radial dimension D; and 0.4≤d/D≤0.55.

In one embodiment, the food processor is configured as a blender, a high speed blender, a slow juicer, a juice extractor, or a soymilk maker. Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

The above-mentioned and/or additional aspects and advantages of the present disclosure will become apparent and more readily appreciated from the following descriptions made with reference to the drawings, in which.

Figure 1:
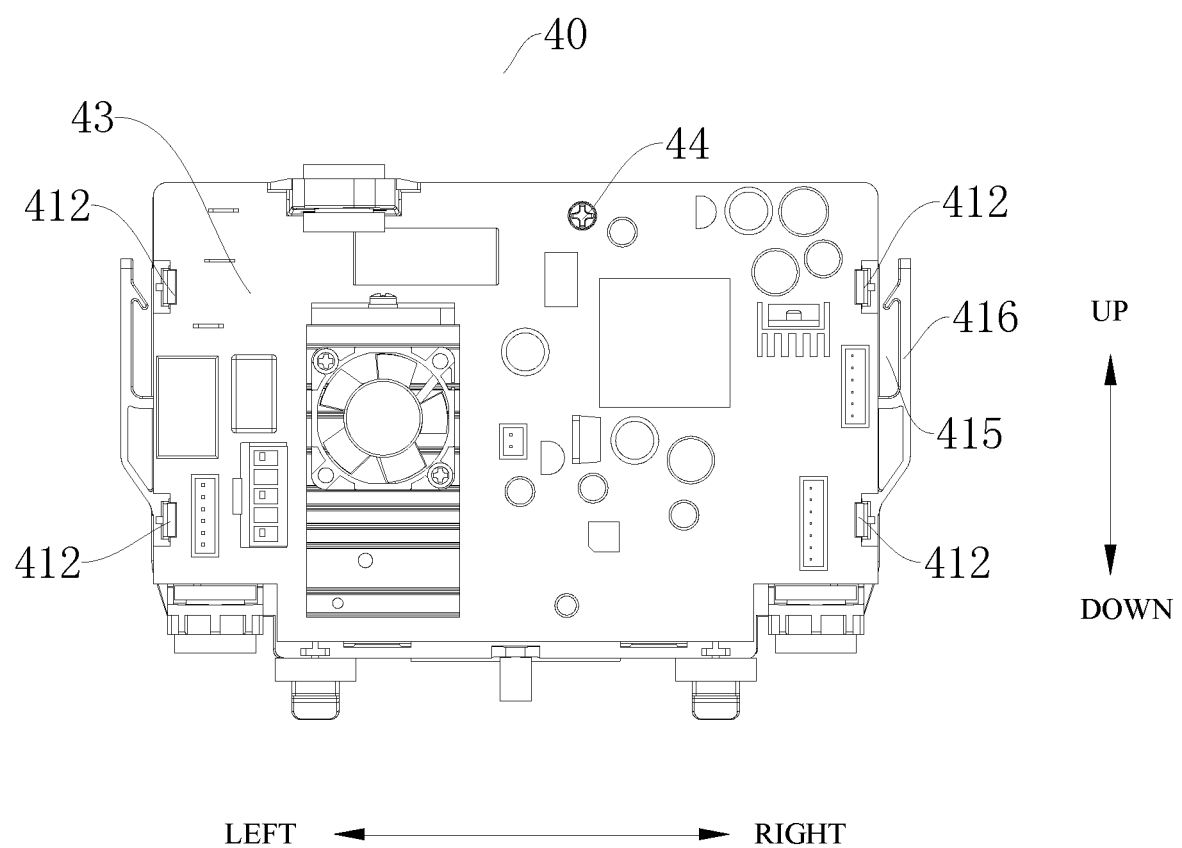
FIG. 1 is a front view of a power supply board assembly according to an embodiment of the present disclosure.

REFERENCE NUMERALS food processor 200; processing container 210;
base 100;
housing 10; mounting cavity 101;
power assembly 20; electric motor 21; fan wheel 22; stator core 23; stator yoke 231; stator teeth 232; stator slot 233; stator hole 234; stator tooth body 235; stator tooth shoe 236; winding 24; rotor core 25; first bracket 26; second bracket 27; drive shaft 28;
coupler 30;
power supply board assembly 40; mounting bracket 41; first hook 411; second hook 412; arm portion 4121; hook portion 4122;
reinforcement structure 4123; edge support portion 413; middle support portion 414; wire passing hole 415; wire clamping structure 416; wire clamping plate 4161; clamping projection 4162; filter board 42; power supply board 43; threaded fastener 44;
capacitive component 50;
display assembly 60;
air guide duct 70; air guide bottom plate 71.

DETAILED DESCRIPTION OF THE DISCLOSURE

Reference will be made in detail to embodiments of the present application, and the examples of the embodiments are illustrated in the drawings. The embodiments described herein with reference to drawings are illustrative, and merely used to explain the present application. The embodiments shall not be construed to limit the present application.

In the description of the present application, it is to be understood that terms such as "center", "length", "width", "thickness", "upper", "lower", "front", "rear", "left", "right", "inner", "outer", "clockwise", "anticlockwise", "axial", "radial", and "circumferential" should be construed to refer to the orientation as then described or as shown in the drawings under discussion. These relative terms are for convenience of description and do not require that the present application be constructed or operated in a particular orientation, thus cannot be construed to limit the present application. Furthermore, the feature defined with "first" and "second" may include one or more of this feature explicitly or implicitly. In the description of the present disclosure, "a plurality of" means two or more unless otherwise stated.

A power supply board assembly 40 for a food processor 200 according to an embodiment of a first aspect of the present disclosure will be described below with reference to the drawings.

Referring to FIGS. 1 to 7, the power supply board assembly 40 for the food processor 200 according to the embodiment of the present disclosure may include a mounting bracket 41, a power supply board 43, and a filter board 42.

Figure 2:
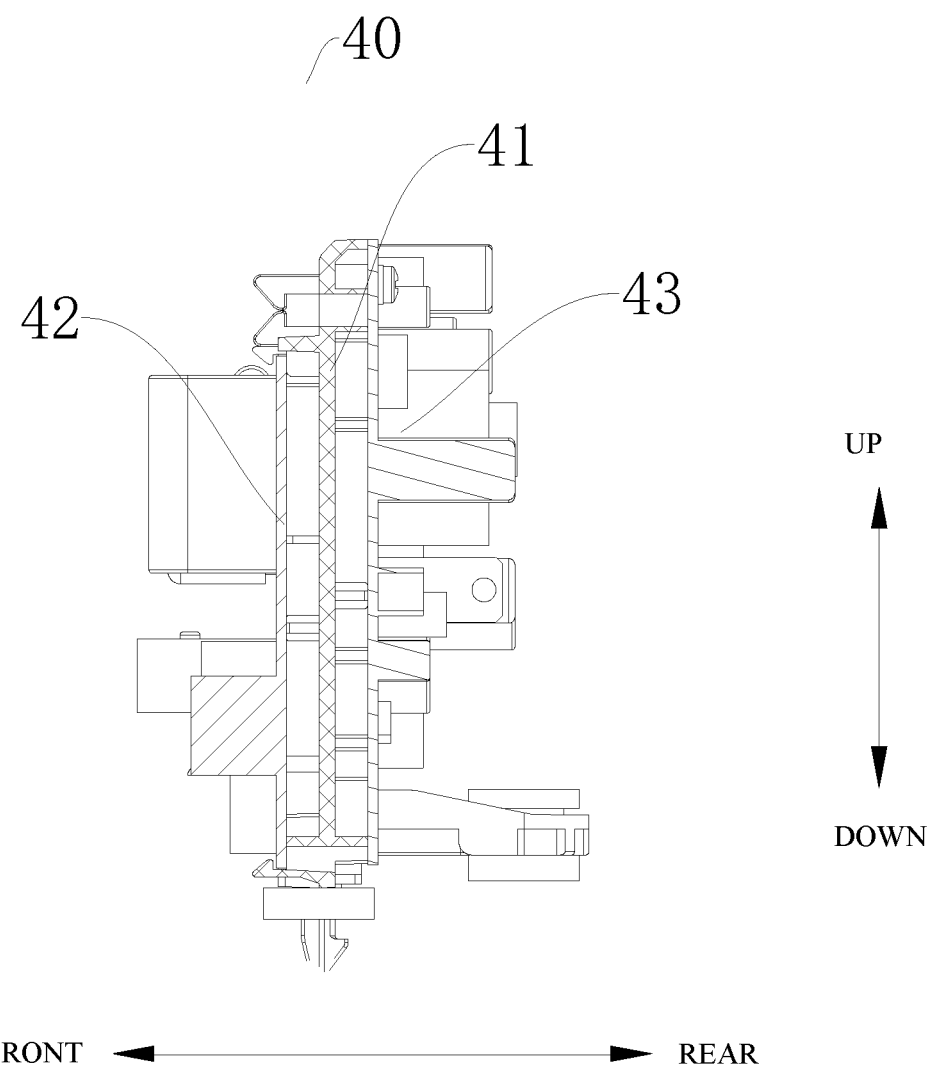
FIG. 2 is a sectional view of the power supply board assembly according to the embodiment of the present disclosure.

As shown in FIG. 2, the power supply board 43 may be a printed circuit board (PCB board), the filter board 42 may be an electromagnetic compatibility board (EMC board), and the power supply board 43 and the filter board 42 may be mounted at two opposite sides of the mounting bracket 41 respectively. That is, the power supply board 43 and the filter board 42 may be arranged opposite to each other in a thickness direction of the mounting bracket 41, and the filter board 42 and the power supply board 43 may be electrically connected with an electric wire, or in other ways.

Therefore, in the power supply board assembly 40 for the food processor 200 according to the embodiment of the present disclosure, by providing the mounting bracket 41, and mounting the power supply board 43 and the filter board 42 at two opposite sides of the mounting bracket 41 respectively, the number of mounting components may be decreased; since the power supply board 43 and the filter board 42 are fixed to one mounting bracket 41, which makes the structure more compact, reduces the occupied space of the power supply board assembly 40, is more convenient to mount, and has lower costs.

In the embodiment where the power supply board 43 and the filter board 42 are connected with wires, a back-to-back arrangement enables an internal wiring between the power supply board 43 and the filter board 42 to be shorter, which may simplify the wiring between the power supply board 43 and the filter board 42, and lowers a difficulty in maintenance. The electric wires may be connected or extracted from two sides of the power supply board 43 and the filter board 42 in a horizontal direction respectively. The electric wires in the food processor 200 are shorter and more organized, which is not only convenient for assembly, but also may make an electromagnetic compatibility consistency between multiple electric wires better.

Figure 3:
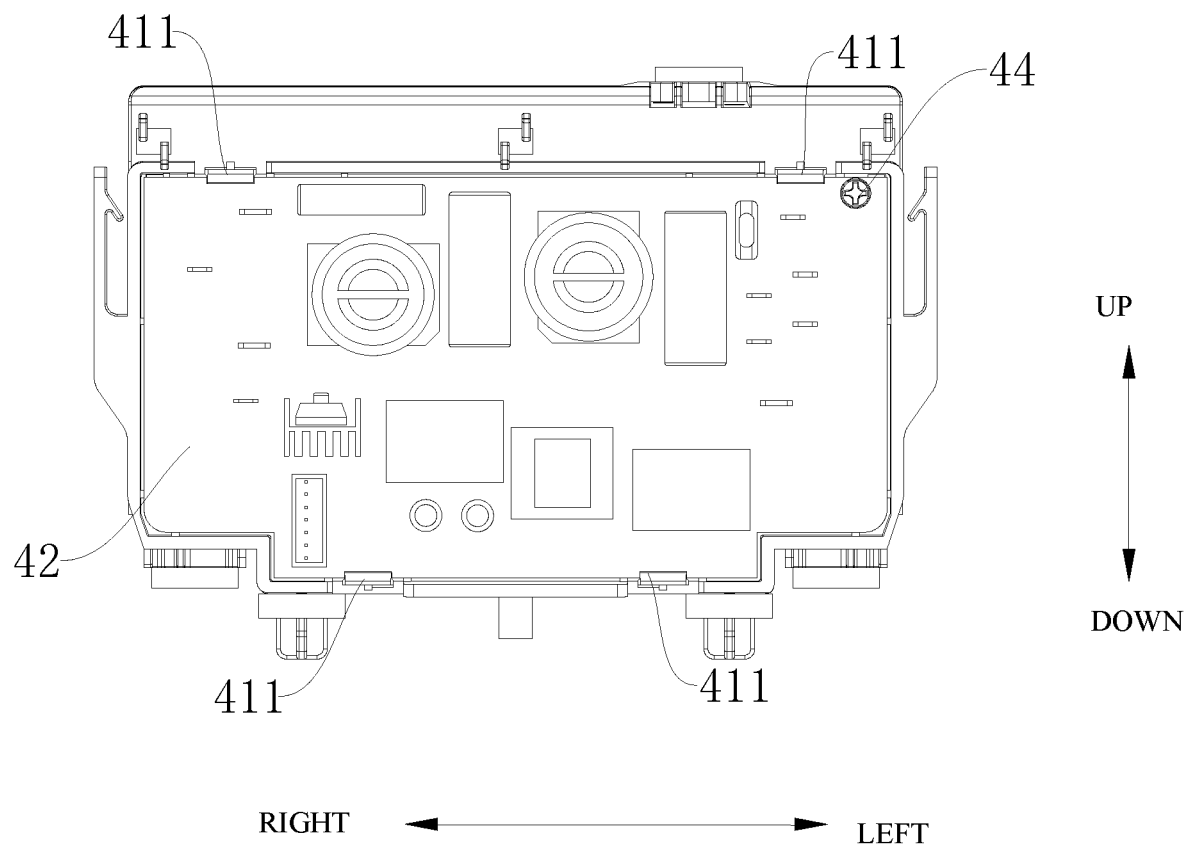
FIG. 3 is a rear view of the power supply board assembly according to the embodiment of the present disclosure.

As shown in FIGS. 1 and 3, in some embodiments of the present disclosure, the power supply board 43 may be fixed to one side of the mounting bracket 41 by a threaded fastener 44 or a snap-fit structure or the threaded fastener 44 and the snap-fit structure. The filter board 42 may also be fixed to the other side of the mounting bracket 41 by the threaded fastener 44 or the snap-fit structure or the threaded fastener 44 and the snap-fit structure. In this way, it is ensured that the power supply board 43, the filter board 42 and the mounting bracket 41 be connected reliably.

As shown in FIGS. 1 to 5, in some examples of the present disclosure, the mounting bracket 41 includes a plurality of first hooks 411 and a plurality of second hooks 412, and the plurality of first hooks 411 are located at one side of the mounting bracket 41 (front side as shown in FIG. 2), the plurality of second hooks 412 are located at the other side of the mounting bracket 41 (rear side as shown in FIG. 2), the plurality of first hooks 411 are provided on one pair of two opposite ends of the mounting bracket 41 (such as an upper end and a lower end in FIG. 3), and each end is provided with at least one hook to snap the two opposite ends of the power supply board 43 (the upper and lower ends of the power supply board 43) to the mounting bracket 41.

The plurality of second hooks 412 are located at the other side of the mounting bracket 41 (right side as shown in FIG. 2), the plurality of second hooks 412 are provided on the other pair of two opposite ends of the mounting bracket 41 (such as a left end and a right end in FIG. 1), and each end is provided with at least one hook to snap the filter board 42 to the mounting bracket 41.

Thus, it may be ensured that the power supply board 43 and the filter board 42 be fixed firmly, and an overall structural strength of the mounting bracket 41 may be guaranteed by providing the first and second hooks 411 and 412 at different positions of the mounting bracket 41.

Figure 4:
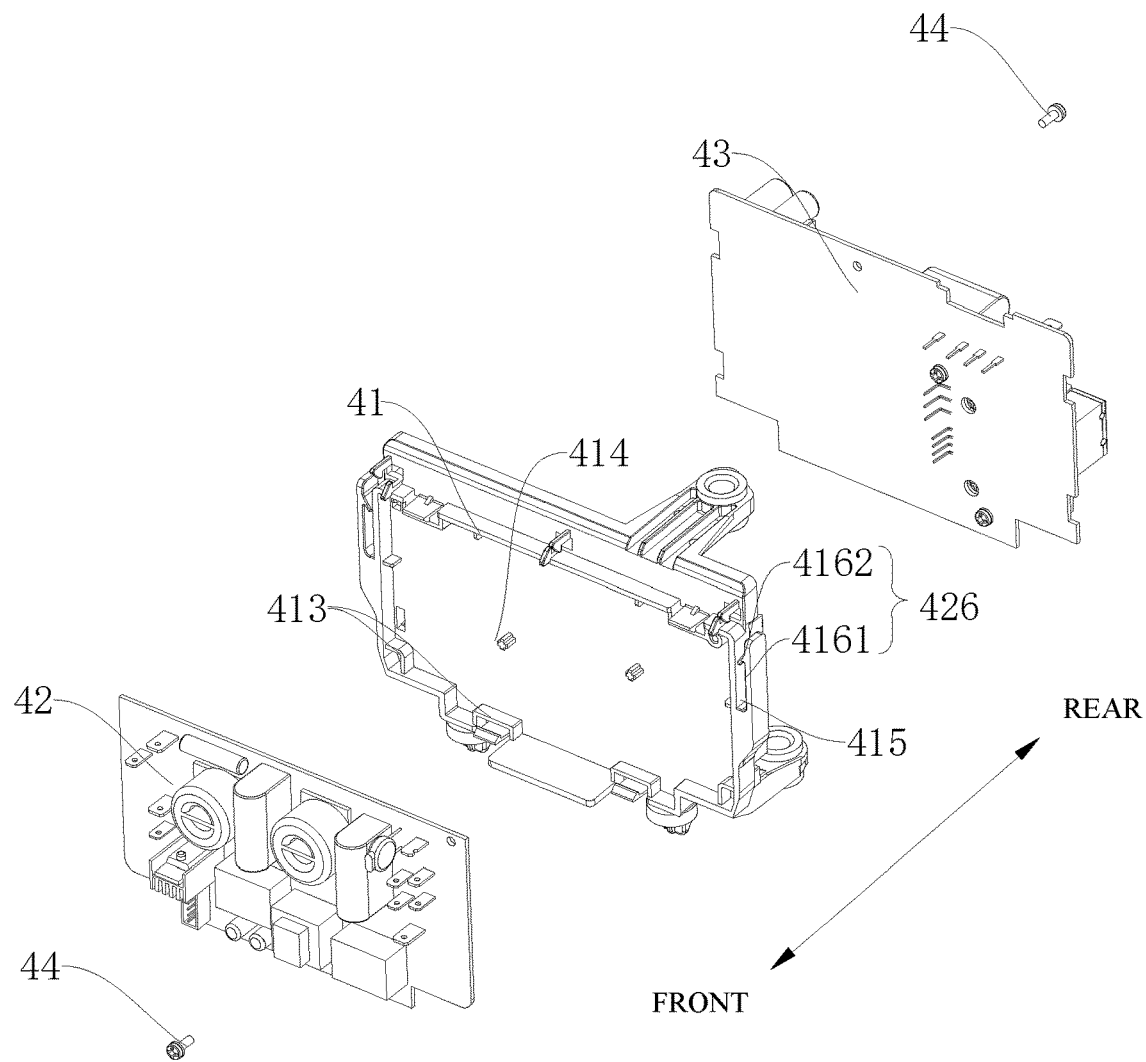
FIG. 4 is an exploded view of the power supply board assembly according to the embodiment of the present disclosure.
Figure 5:
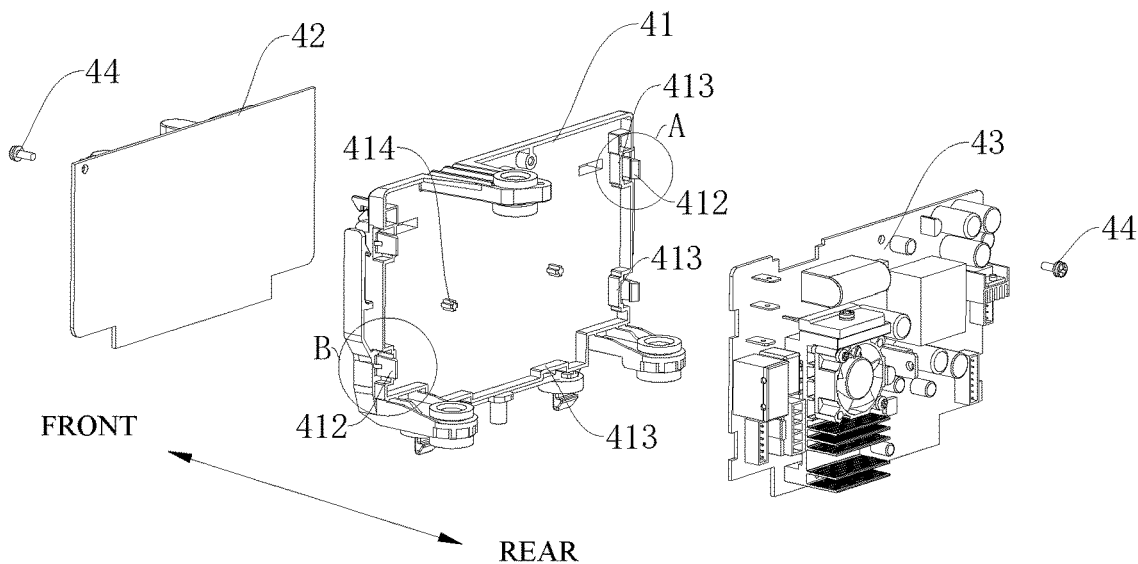
FIG. 5 is another exploded view of the power supply board assembly according to the embodiment of the present disclosure.
Figure 6:
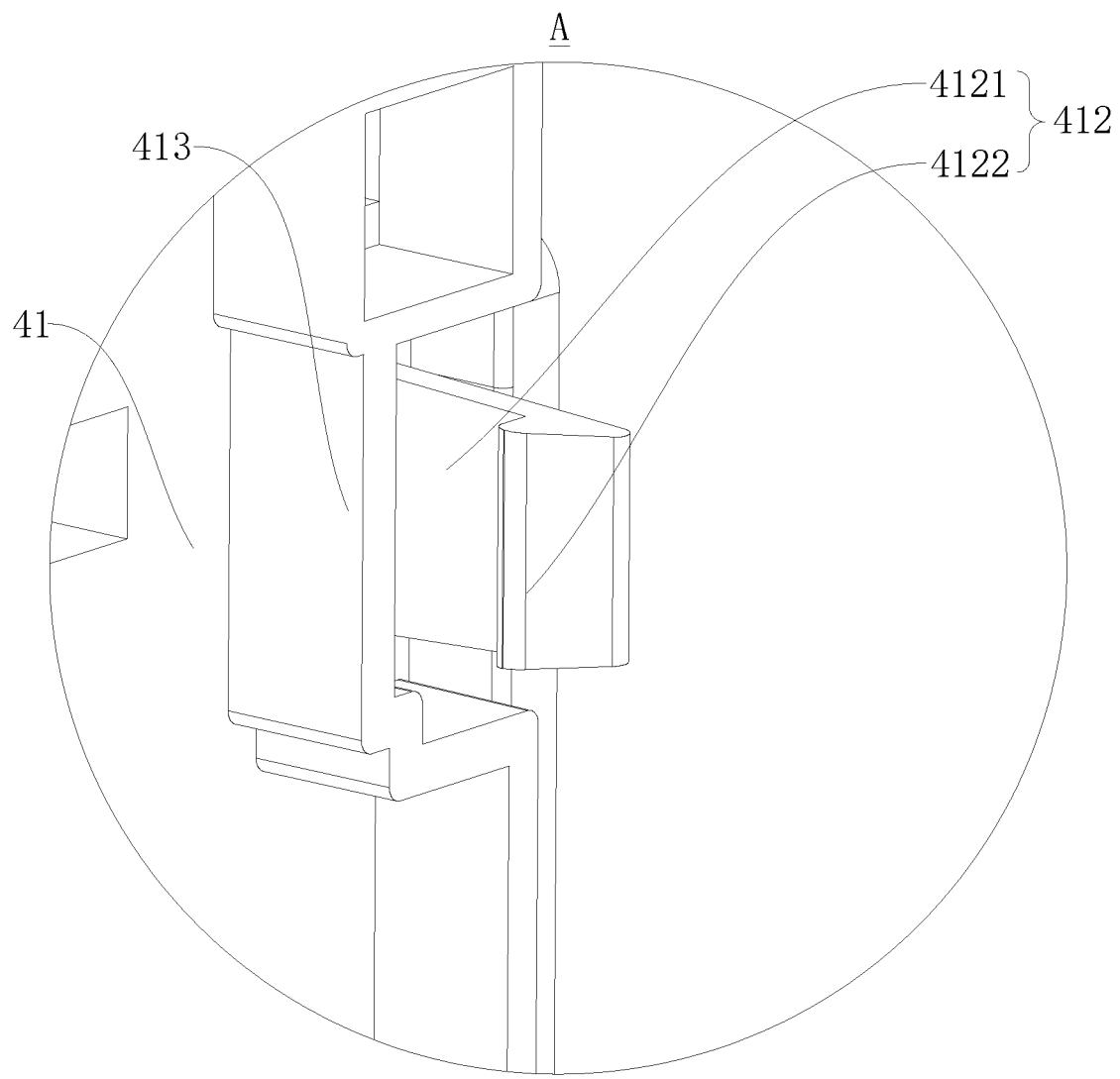
FIG. 6 is an enlarged view of circle A in FIG. 5.
Figure 7:
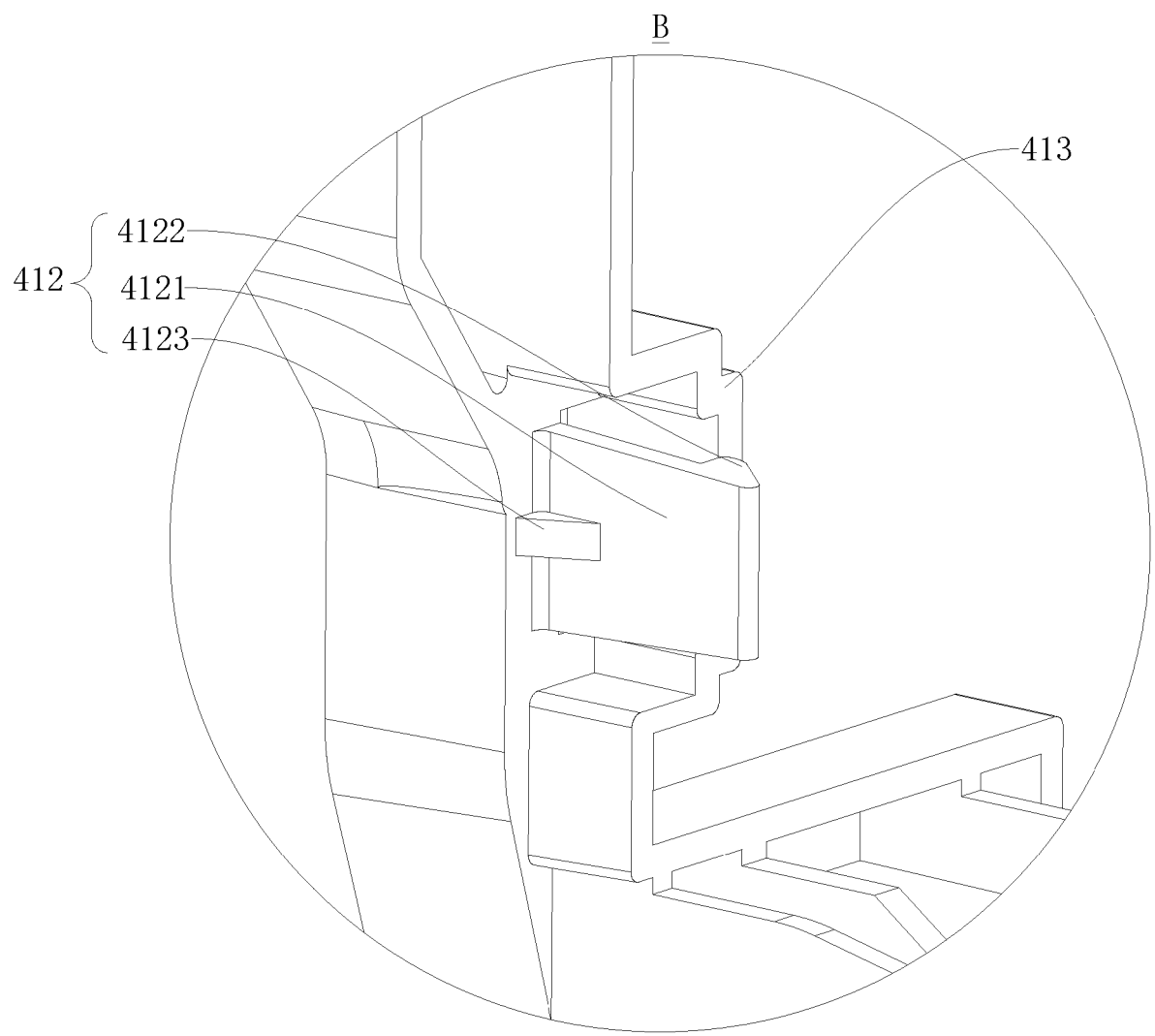
FIG. 7 is an enlarged view of circle B in FIG. 5.

As shown in FIGS. 4 to 7, in some embodiments of the present disclosure, the first hook 411 or the second hook 412 may include an arm portion 4121 and a hook portion 4122. One end of the arm portion 4121 (away from the power supply board 43 or the filter board 42) is connected to the mounting bracket 41, the other end of the arm portion 4121 (close to the power supply board 43 or the filter board 42) is provided with the hook portion 4122, and the hook portion 4122 protrudes from a side surface of the arm portion 4121. For example, as shown in FIGS. 6 and 7, the hook portion 4122 faces a center line direction of the mounting bracket 41, and the power supply board 43 or the filter board 42 may be snapped to the mounting bracket 41 with the hook portion 4122 to stop the power supply board 43 or the filter board 42 and to guarantee the connection reliability of the power supply board 43 and the filter board 42 with the mounting bracket 41.

As shown in FIGS. 6 and 7, in some examples of the present disclosure, in order to ensure structural strength and avoid damage to the hook (including the first hook 411 and the second hook 412), a junction between the arm portion 4121 and the mounting bracket 41 is provided with a reinforcing structure 4123. For example, the reinforcing structure 4123 may be a reinforcing rib, improving reliability.

As shown in FIGS. 4 and 5, in some embodiments of the present disclosure, a side surface of the mounting bracket 41 facing the power supply board 43 (rear side shown in FIG. 5) is provided with a first support structure which protrudes from a rear side surface of the mounting bracket 41 to support the power supply board 43, which guarantees a gap between the power supply board 43 and the surface of the mounting bracket 41, guaranteeing the overall safety of the power supply board assembly 40 and avoiding the overall damage caused by an accidental damage to the power supply board 43.

A side surface of the mounting bracket 41 facing the filter board 42 (front side shown in FIG. 4) is provided with a second support structure which protrudes from the front side surface of the mounting bracket 41 to support the filter board 42, which guarantees a gap between the filter board 42 and the surface of the mounting bracket 41, guaranteeing the overall safety of the power supply board assembly 40 and avoiding the overall damage caused by an accidental damage to the filter board 42.

As shown in FIGS. 4 and 5, in some examples of the present disclosure, the first or second support structure or each of the first and second support structures includes a plurality of edge support portions 413 and a middle support portion 414, and the plurality of edge support portions 413 are arranged at intervals in a circumferential direction of the mounting bracket 41, the edges of the power supply board 43 or the filter board 42 may be supported by the edge support portions 413, and the middle portion of the power supply board 43 or the filter board 42 may be supported by the middle support portion 414, ensuring that the power supply board 43 or the filter board 42 receives an uniform force and avoiding stress concentration, which at the same time, reduces an overall weight of the power supply board assembly 40 and lowers costs.

As shown in FIGS. 4 and 5, in some examples of the present disclosure, the edge support portion 413 includes a support plate which is arranged adjacent to the first or second hook 411 or 412, and the support plate is formed into a U shape substantially. The first or second hook 411 or 412 is provided at an opening of the U shape of the support plate.

As shown in FIGS. 1 and 4, in some embodiments of the present disclosure, in order to simplify the wiring between the filter board 42 and the power supply board 43, at least one end of the mounting bracket 41 is provided with a wire passing hole 415. For example, as shown in FIG. 1, each of the left and right ends of the mounting bracket 41 is provided with the wire passing hole 415 which penetrates through a thickness direction of the mounting bracket 41, and the length of the electric wire connected between the power supply board 43 and the filter board 42 is relatively short, effectively simplifying wiring and facilitating later maintenance.

As shown in FIGS. 1 and 4, in some examples of the present disclosure, the wire passing hole 415 has an opening structure and extends to the edge of the mounting bracket 41, and a wire clamping structure 416 is provided at the wire passing hole 415. A user may clamp the electric wire penetrating through the wire passing hole 415 with the wire clamping structure 416, avoiding messy wiring and reducing the difficulty in later maintenance.

As shown in FIG. 4, in some examples of the present disclosure, the wire clamping structure 416 includes a wire clamping plate 4161 and a clamping projection 4162. One end of the wire clamping plate 4161 (lower end as shown in FIG. 4) is connected with the edge of the mounting bracket 41, the wire passing hole 415 is defined by the edges of the wire clamping plate 4161 and the mounting bracket 41, and the clamping projection 4162 is provided at the other end of the wire clamping plate 4161, and is located at an inner surface of the wire clamping plate 4161 facing the edge of the mounting bracket 41, and the electric wire in the wire passing hole 415 is snapped by the clamping projection 4162, simplifying the wiring.

As shown in FIGS. 1 and 3, in some examples of the present disclosure, in order to guarantee the connection reliability of the power supply board 43 and the filter board 42 with the mounting bracket 41, the edges of the power supply board 43 and the filter board 42 are provided with fixing holes respectively, and the threaded fastener 44 is configured to connect the power supply board 43 and the filter board 42 to the two opposite side surfaces of the mounting bracket 41 by being fitted with the fixing hole.

Based on the inventor's discovery and knowledge of the following facts and problems, the present application proposes a base 100 for a food processor 200 according to an embodiment of a second aspect.

The food processor is mainly composed of a cup assembly and a base assembly, and the base assembly includes an upper cover assembly, a power assembly, a driving board assembly, or the like, and the cup assembly is connected with the base assembly with a coupler, to implement related functional control.

In the related art, an electronic control system of the food processor is usually disposed at a rear end of the food processor and located below the coupler. In the case of the seal failure of the coupler or abnormal overflow, a liquid outside the food processor may flow into the electric control system, disabling the food processor to work, even causing safety risks. In addition, the power assembly of the food processor is generally a series-excited electric motor. The series-excited electric motor is required to be commutated using a carbon brush, and the carbon brush is continuously worn during operation, which shortens the service life of the series-excited electric motor, leading to the short service life of the entire food processor, large noises and poor user experience.

Hereinafter, a base 100 for a food processor 200 according to an embodiment of the second aspect of the present disclosure will be described with reference to the drawings.

Figure 8:
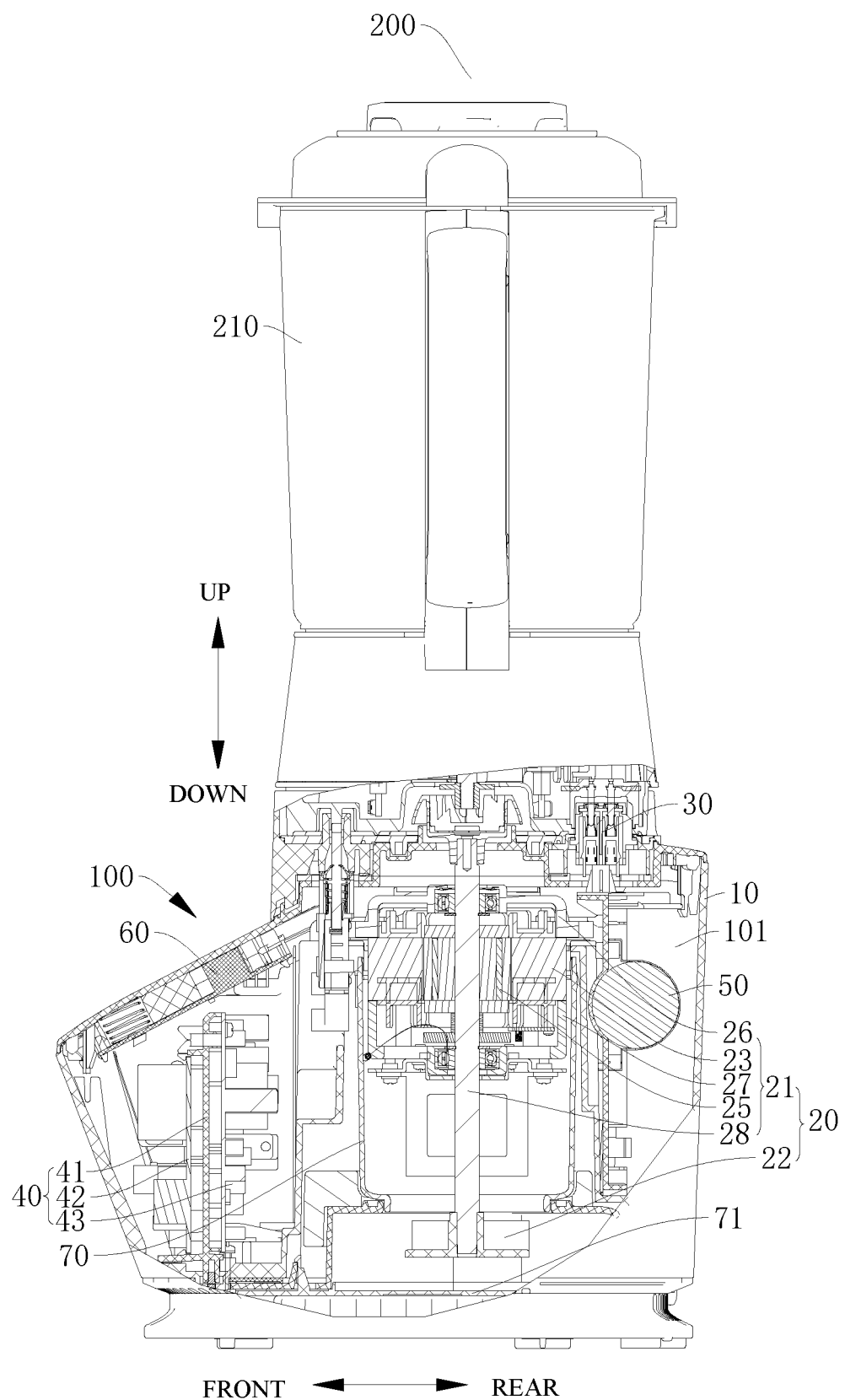
FIG. 8 is a right view of a food processor according to an embodiment of the present disclosure.
Figure 9:
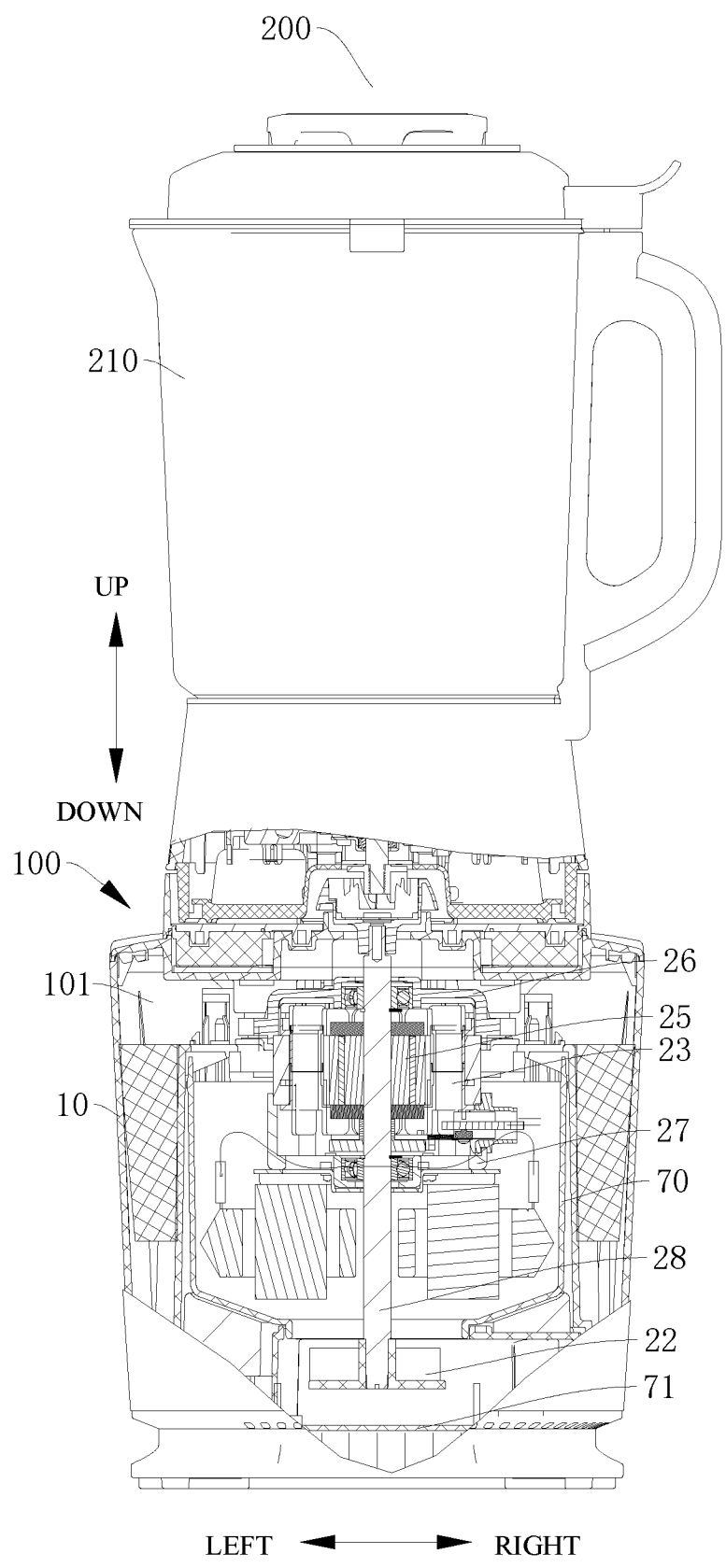
FIG. 9 is a front view of the food processor according to the embodiment of the present disclosure.

Referring to FIGS. 8 and 9, the processing container 210 of the food processor 200 may be disposed on the base 100. In one embodiment, the processing container 210 may be configured as the cup assembly. In addition, the processing container 210 is detachable, and may be removed by the user during use, to conveniently place and fetch food and clean the processing container 210.

The base 100 for a food processor 200 according to an embodiment of the present disclosure may include: a housing 10, a power assembly 20, a coupler 30, and a driving board assembly, and the driving board assembly may be the power supply board assembly 40 according to the embodiment of the first aspect of the present disclosure.

In one embodiment, a mounting cavity 101 may be defined in the housing 10, and the power assembly 20 may be disposed in the mounting cavity 101. When the processing container 210 is provided at the base 100, the power assembly may be in transmission connection with a food processing member extending into the processing container 210. Thus, the food processing member may be driven by the power assembly 20 to rotate relative to the processing container 210, processing the food in the processing container 210.

In addition, the coupler 30 may be mounted at an upper portion of the housing 10 and located behind and above the power assembly 20. When the processing container 210 is placed at the base 100, the coupler 30 may be coupled with the processing container 210 and the power assembly 20 may be in transmission connection with the processing container 210. Thus, the connection structure between the coupler 30 and the power assembly 20 does not interfere with each other, and the structural design is more reasonable.

In one embodiment, the coupler 30 may include an upper coupler and a lower coupler. The upper coupler may be provided at the processing container 210, and the lower coupler may be provided behind and above the housing 10. The coupling between the upper and lower couplers may realize an electric connection and a signal connection between the base 10 and the processing container 210, and the power supply board assembly 40 in the base 10 may control the processing container 210 functionally with the coupler 30.

The power supply board assembly 40 may be disposed in the mounting cavity 101, and the power supply board assembly 40 may be electrically connected to the power assembly 20, and the power supply board assembly 40 may control a working condition of the power assembly 20. In addition, in the horizontal direction, the power supply board assembly 40 and the coupler 30 may be staggered. That is, the position where the power supply board assembly 40 is provided may avoid the overflow area.

Thus, when the coupler 30 fails to be sealed, or abnormal overflow occurs in a cleaning process by the user, even if flowing down from the position where the coupler 30 is located into the mounting cavity 101, the liquid will not flow into the power supply board assembly 40, which may effectively avoid malfunction or safety accidents due to a water damage to the power supply board assembly 40, prolonging the service life and improving the safety of the base 100 and lowering a maintenance rate.

In the base 100 for the food processor 200 according to the embodiment of the present disclosure, the power supply board assembly 40 and the coupler 30 are staggered in the horizontal direction, which may effectively avoid malfunction or safety accidents due to a water damage to the power supply board assembly 40, prolonging the service life and improving the safety of the base 100 and lowering a maintenance rate.

In the base 100 according to the embodiment of the present disclosure, by adopting the power supply board assembly 40 according to the embodiment of the first aspect of the present disclosure, the number of mounting components may be decreased, and the occupied space of the power supply board assembly 40 is reduced, which further facilitates reduction of a volume of the base 100, miniaturizes the food processor 200, simplifies the wiring between the power supply board 43 and the filter board 42, and lowers the difficulty in maintenance.

It should be noted that, in the present disclosure, the power supply board assembly 40 and the coupler 30 may be partially or completely staggered in the horizontal direction, so long as the power supply board assembly 40 avoids the overflow area to prevent the water damage thereto. In other words, a vertical projection of the power supply board assembly 40 may not completely overlap a vertical projection of the coupler 30. In one embodiment, the vertical projection of the power supply board assembly 40 may also not overlap the vertical projection of the coupler 30 at all, further ensuring that the power supply board assembly 40 avoids the overflow area, which is more secure and reliable. For example, in the embodiment as shown in FIG. 8, the coupler 30 may be provided at the rear end of the housing 10, and the power supply board assembly 40 may be provided at the front end of the mounting cavity 101, and the power supply board assembly 40 may be away from the overflow area.

According to some embodiments of the present disclosure, as shown in FIG. 8, the base 100 may further include a capacitive component 50 which may provide a stable power source for the power assembly 20, and the power assembly 20 works more stably. However, due to a relatively large capacity of the capacitive component 50, the capacitive component 50 is prone to burst and electrolyte in the capacitive component 50 may be sprayed out in an abnormal circuit failure. In the present disclosure, the capacitive component 50 is provided in the mounting cavity 101 apart from the power supply board assembly 40. Therefore, even if the capacitive component 50 bursts, the electrolyte will not be sprayed on the power supply board assembly 40, which may avoid accidents of the power supply board assembly 40, such as malfunction and fire.

Further, as shown in FIG. 8, the capacitive component 50 and the power supply board assembly 40 may be provided at both sides of the power assembly 20. For example, the capacitive component 50 may be provided at a rear side of the power assembly 20, and the power supply board assembly 40 may be provided at a front side of the power assembly 20. Not only the power supply board assembly 40 may be apart from the capacitive component 50, but also the power assembly 20 may be separated from the power supply board assembly 40 and the capacitive component 50 to further protect the power supply board assembly 40 from the electrolyte, which is safer.

In some embodiments of the present disclosure, as shown in FIG. 8, the base 100 may further include a display assembly 60, and the display assembly 60 may be electrically connected to the power supply board assembly 40, to display an operating state of the food processor 200.

In a further embodiment of the present disclosure, the display assembly 60 may have operation keys. The user may control the power supply board assembly 40 with the operation keys, controlling a working mode, state, or the like, of the food processor 200, being more convenient to use.

In addition, the power supply board assembly 40 may be provided below the display assembly 60. Since the display assembly 60 is not communicated with a water source, and the user will consciously prevent the display assembly 60 from contacting the liquid in use or during a cleaning process, the power supply board assembly 40 may be provided below the display assembly 60, and the water damage to the power supply board assembly 40 may be further avoided.

According to a further embodiment of the present disclosure, as shown in FIG. 8, the display assembly 60 may be provided at the front side of the base 100, which is convenient for the user to check the operating state of the food processor 200. Still further, the display device 60 may be disposed obliquely forwards and downwards in the horizontal direction, and the display device 60 and the processing container 210 are staggered in the horizontal direction. That is, the display device 60 protrudes forwards from the processing container 210. Thus, the power supply board assembly 40 below the display assembly 60 may be staggered from the processing container 210 in the horizontal direction to avoid the damage to the power supply board assembly 40 due to an overflow at the junction between the processing container 210 and the base 100.

In some embodiments of the present disclosure, as shown in FIGS. 8 and 9, the food processing member may be configured as a knife assembly, and the power assembly 20 may include an electric motor 21 and a fan wheel 22. The electric motor 21 may be in transmission connection to the knife assembly, and the electric motor 21 may drive the knife assembly to rotate to perform processing on food, such as cutting food. The fan wheel 22 may be provided at a lower portion of the electric motor 21, and the electric motor 21 may also drive the fan wheel 22 to rotate at the same time, and the fan wheel 22 may drive an airflow to dissipate the electric motor 21, and to prevent the electric motor 21 from being overheated and burned out or avoid a safety accident.

Further, as shown in FIGS. 8 and 9, the base 100 may further include an air guide duct 70 and an air guide bottom plate 71, and the air guide duct 70 may be fitted over the electric motor 21, the air guide bottom plate 71 may be provided at a lower end of the housing 10 and located at a lower side of the fan wheel 22, and the lower end of the air guide duct 70 may be connected with the air guide bottom plate 71. Driven by the fan wheel 22, the airflow may flow under the guidance of the air guide duct 70, and finally flow out of an air outlet under the guidance of the air guide bottom plate 71. The air guide duct 70 and the air guide bottom plate 71 may make the airflow more smooth, increase an air volume and improve a heat dissipation effect.

Figure 10:
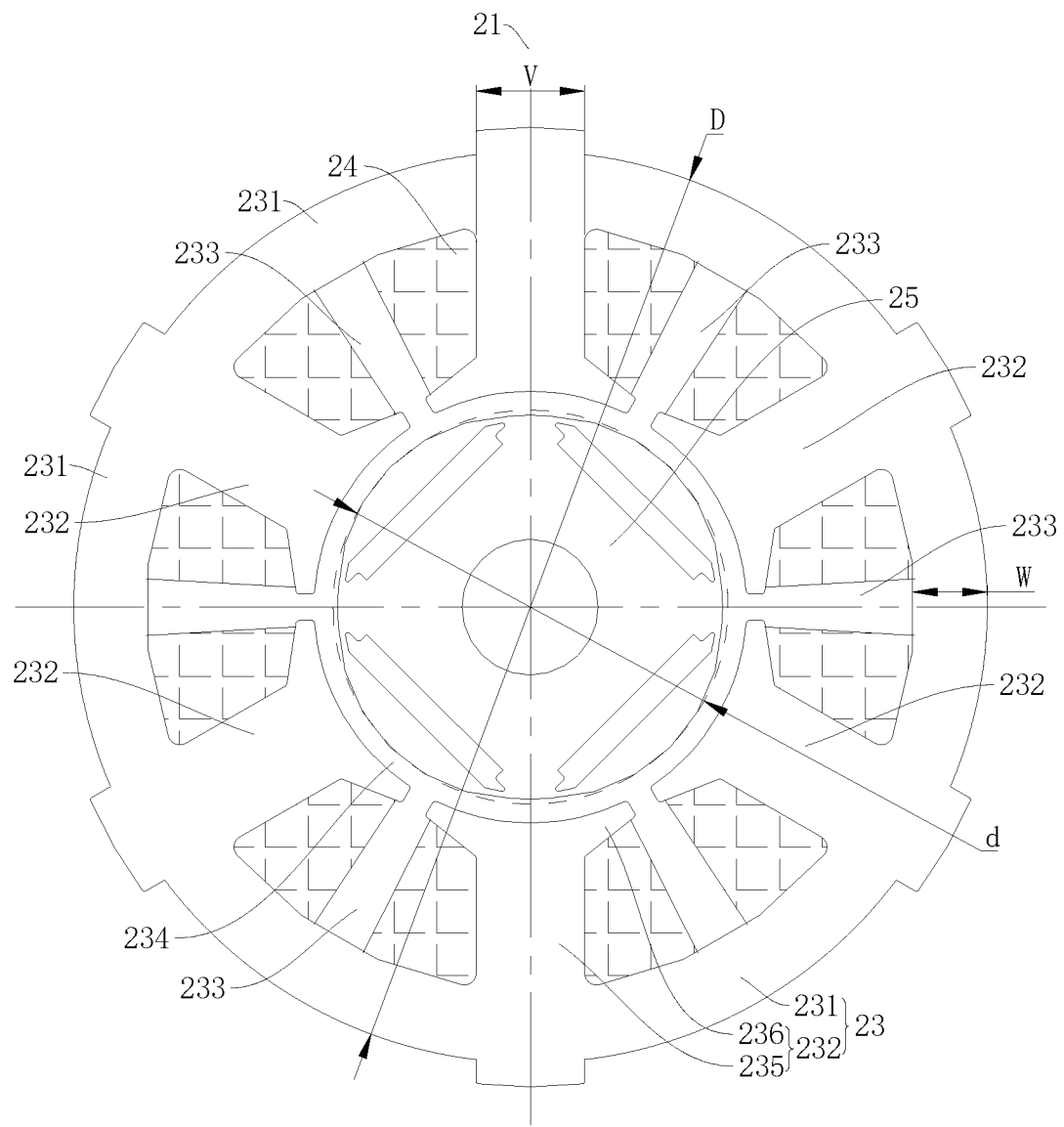
FIG. 10 is a schematic structural diagram of cooperation of a stator assembly and a rotor core of a base according to an embodiment of the present disclosure.
Figure 11:
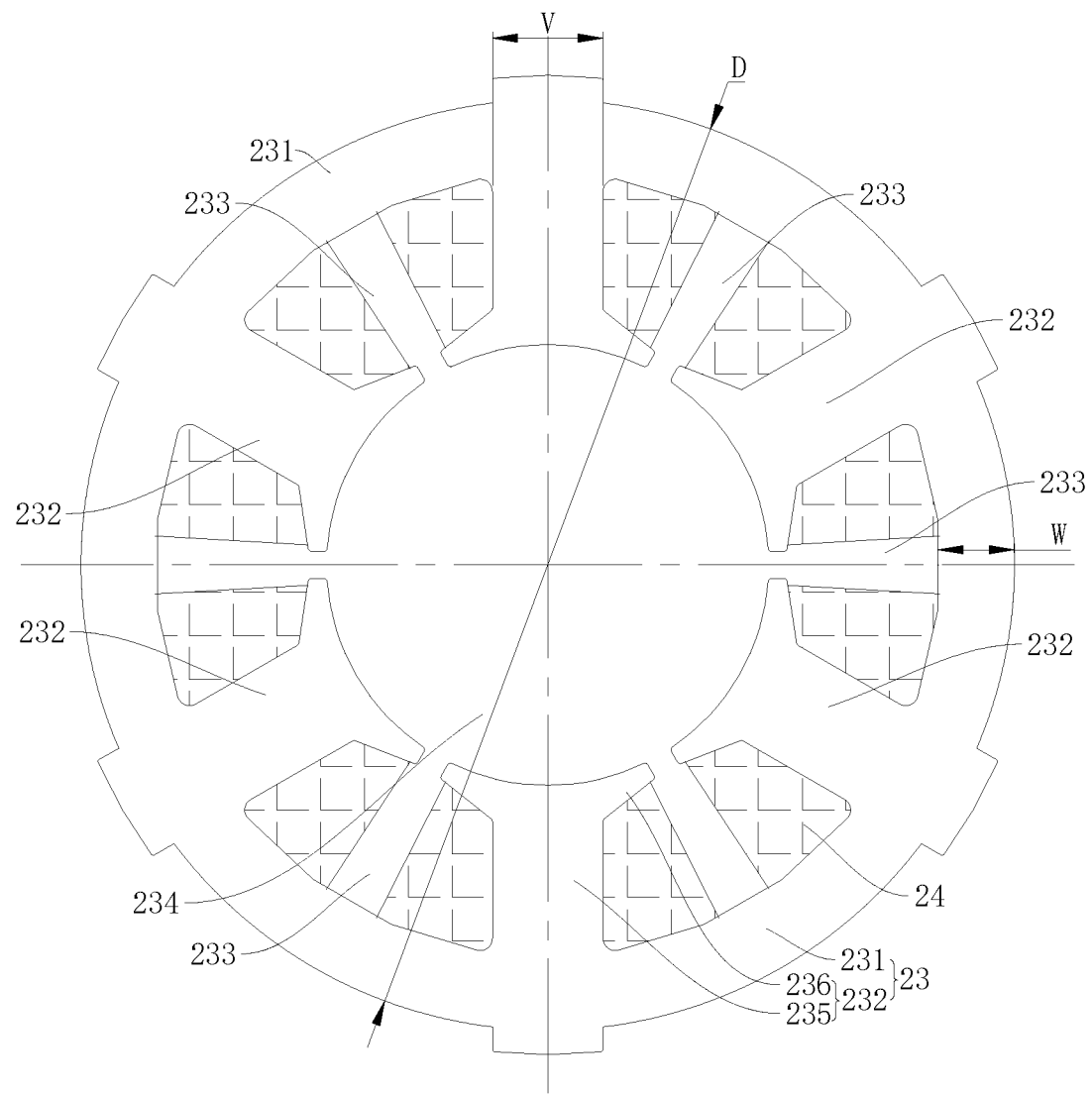
FIG. 11 is a schematic structural diagram of the stator assembly of the base according to the embodiment of the present disclosure.
Figure 12:
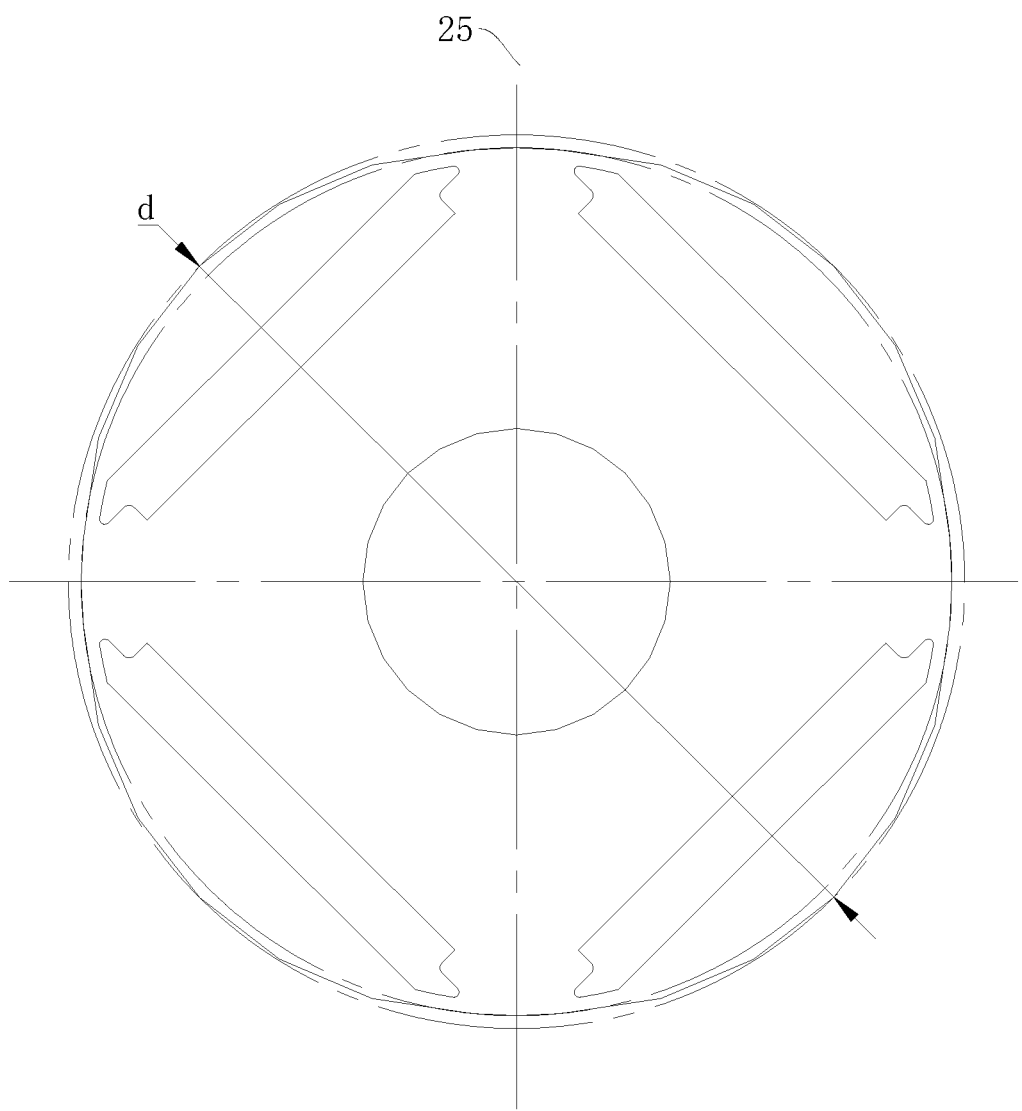
FIG. 12 is a schematic structural diagram of the rotor core of the base according to the embodiment of the present disclosure.

In some embodiments of the present disclosure, as shown in FIGS. 10 to 12, the power assembly 20 includes the electric motor 21. The stator core 23 of a stator assembly of the electric motor 21 may include: a stator yoke 231 and a plurality of stator teeth 232, and the stator yoke 231 may be ring-shaped, and the plurality of stator teeth 232 may be provided at an inner peripheral face of the ring-shaped stator yoke 231. The stator yoke 231 may provide a mechanical support for the plurality of stator teeth 232 to fix the stator teeth 232. The plurality of stator teeth 232 may be spaced apart in the circumferential direction of the stator yoke 231, two adjacent stator teeth 232 may define a stator slot 233 therebetween, and a winding 24 of the electric motor 21 may be wound around the stator teeth 232 through the stator slot 233.

In addition, the plurality of stator teeth 232 may define a stator hole 234 coaxial with the stator yoke 231, a rotor core 25 may be provided in the stator hole 234, and the rotor core 25 may be coaxial with the stator hole 234. The rotor core 25 may rotate around an axis in the stator hole 234, and a predetermined distance may be formed between the rotor core 25 and an inner peripheral face of the stator hole 234 to make the rotor core 25 rotate more smoothly.

Referring to FIGS. 10 and 11, each of the stator teeth 232 may include a stator tooth body 235 and a stator tooth shoe 236, and the stator tooth body 232 is connected with the stator yoke 231, and the stator teeth 232 and the stator yoke 231 may be integrally connected. The stator tooth shoe 236 is provided at an inner end of the stator tooth body 235, which may on the one hand, reduce an air gap reluctance between the stator teeth 232 and the rotor core 25 and improve the magnetic field distribution, and on the other hand, fix the winding 24 on the stator teeth 232 more reliably to prevent the winding 24 from being loosened from the inner end of the stator teeth 232.

In addition, the width of the stator yoke 231 may be W, and the width of each of the stator tooth bodies 235 may be V. For the stator core 23 with the same shape, i.e., in the case of the constant maximum radial dimension D of the stator core 23, if W:V is too small, the magnetic flux density of the stator teeth 232 will be too high, and even the magnetic flux density is saturated, the iron loss of the stator teeth 232 is relatively large, causing the excessive temperature rise of the stator teeth 232 when the electric motor 21 is operating. In addition, the stator slot 233 between two adjacent stator teeth 232 is too small, and the distance between two adjacent stator teeth 232 is too short, which easily forms an electromagnetic circuit, reducing the energy efficiency of the electric motor 21.

If W:V is too large, the magnetic flux density of the stator yoke 231 will be too high, and even the magnetic flux density is saturated. When the electric motor 21 is in operation, the iron loss of the stator yoke 231 is relatively large, causing the excessive temperature rise.

Therefore, in some embodiments of the present disclosure, with respect to the width W of the stator yoke 231 and the width V of each of the stator tooth bodies 235, the following equation may be satisfied: $W:V=0.6-0.7$, and the stator yoke 231 and the stator teeth 232 may distribute the magnetic flux density of the stator core 23 more reasonably, and the temperature rise of the electric motor 21 is more balanced, to prolong the service life of the electric motor 21 and improve the safety performance of the electric motor 21. For example, in some embodiments of the present disclosure, the ratio W:V of the width W of the stator yoke 231 to the width V of the stator tooth body 235 may be 0.6, 0.63, 0.65, 0.68, 0.7, or the like, respectively.

In addition, as shown in FIGS. 10 to 12, the stator yoke 231 has a maximum radial dimension of D and the rotor core 25 has a maximum radial dimension of d. For the stator core 23 with the same shape, i.e., in the case of the constant maximum radial dimension D of the stator core 23, when d/D is too small, the maximum radial dimension d of the rotor core 25 is too small. If the electric motor 21 is operating at a low speed, for example, if a speed of the electric motor 100 is less than 5000 rpm, a load capacity of the rotor core 25 is too small, and under the condition of driving the same load, the rotor core 25 with a maximum radial dimension d that is too small will be overheated, which affects the normal operation of the electric motor 21, reduces the efficiency of the electric motor 21 and may even cause damage.

When d/D is too large, a cogging torque of the electric motor 21 and a moment of inertia of the rotor core 25 will be increased. If the electric motor 21 is operating at a high speed, for example, when the speed of the electric motor 100 is greater than 10000 rpm, the electric motor 21 will generate vibration, and then generate a large noise, which will affect the performance of the electric motor 21 and user experience.

Therefore, in some embodiments of the present disclosure, with respect to the maximum radial dimension D of the stator yoke 231 and the maximum radial dimension d of the rotor core 25, the following equation is satisfied: $0.4 \leq d/D \leq 0.55$, which may increase an output force of the rotor core 25 of the electric motor 21, enable the electric motor 21 to be more efficient, prevent the rotor core 25 from heating to be safer and prevent the electric motor 21 from generating large vibration noises. For example, in some embodiments of the present disclosure, the ratio d/D of the maximum radial dimension D of the stator yoke 231 to the maximum radial dimension d of the rotor core 25 may be 0.45, 0.48, 0.51, 0.54, or the like, respectively.

It should be noted that in some embodiments of the present disclosure, the outer contours of the stator core 23 and the rotor core 25 are both circular, and the maximum radial dimension refers to the diameter of the circular outer contour of each of the stator core 23 and the rotor core 25. In some other embodiments of the present disclosure, the outer contours of the stator core 23 and the rotor core 25 are not circular, and the maximum radial dimension may be understood as a dimension of a position at which the radial dimension passing through the axis of the outer contour of each of the stator core 23 and the rotor core 25 is the largest.

In some embodiments of the present disclosure, as shown in FIGS. 8 and 9, the electric motor 21 of the power assembly 20 may further include a first bracket 26, a second bracket 27, and a drive shaft 28, and the first and second brackets 26 and 27 are provided at two axial ends of the stator assembly of the electric motor 21 respectively to limit and protect the stator assembly and the rotor core 25. The drive shaft 28 is connected with the rotor core 25 of the electric motor 21, and extends out of at least one of the first and second brackets 26 and 27 to output a driving force of the rotor core 25, to drive the food processing member, the fan wheel 22, or the like to operate.

According to some embodiments of the present disclosure, the electric motor 21 of the power assembly 20 may be a variable frequency brushless electric motor. Depending on the type of food to be processed by the food processor 200, the variable frequency brushless electric motor may provide different speeds, torques, and periods of time, or the like, and the food processor 200 having the electric motor 21 is an intelligent motor. In addition, the variable frequency brushless electric motor dispenses with a structure, such as a carbon brush, for commutation, without the phenomenon of carbon brush wear, with lower running noises, which is beneficial to prolonging the service life of the food processor 200 and improving the user experience.

As shown in FIGS. 8 and 9, a food processor 200 according to an embodiment of a third aspect of the present disclosure includes the base 100 for the food processor 200 according to the embodiment of the second aspect of the present disclosure. Since the base 100 for the food preparation machine 200 according to the embodiment of the present disclosure has the above-mentioned embodiments, the food processor 200 according to the embodiment of the present disclosure has a compact structure, good electromagnetic compatibility consistency, and may effectively avoid malfunction or safety accidents due to a water damage to the power supply board assembly 40, prolonging the service life and improving the safety of the base 100 and lowering a maintenance rate.

Referring to FIGS. 8 and 9, the food processor 200 according to an embodiment of the present disclosure includes the processing container 210, the power assembly 20, the food processing member for processing food, and the power supply board assembly 40 according to the embodiment of the first aspect of the present disclosure.

The power supply board assembly 40 is electrically connected with the power assembly 20, to provide power for the power assembly 20. The processing container 210 has a food accommodating cavity defined therein. When using the food processor 200, the user may place the food to be processed in the food accommodating cavity. The food processing member may extend into the food accommodating cavity, and be driven by the power assembly 20 to rotate relative to the processing container 210, processing the food to be processed in the food accommodating cavity.

In the food processor 200 according to the embodiment of the present disclosure, by adopting the power supply board assembly 40 according to the embodiment of the first aspect of the present disclosure, the number of mounting components may be decreased effectively, and the occupied space of the power supply board assembly 40 is reduced, which miniaturizes the food processor 200, simplifies the wiring between the power supply board 43 and the filter board 42, and lowers the difficulty in maintenance.

In one embodiment, in the present disclosure, the food processor 200 may be configured as a blender, a high speed blender, a slow juicer, a juice extractor, or a soymilk maker. The blender has a relatively high rotational speed, and may mix the food more evenly by high-speed agitation; the high speed blender has a high rotational speed, is configured to process harder food, and may release a large amount of photochemical of food existing in peel, kernels and rootstock by breaking walls thereof sufficiently; the slow juice rotates at a low speed and processes food by means of push-type extrusion and low-flexibility extraction; the juice extractor rotates at a high speed to smash and mix more kinds of food; the soymilk maker rotates at a relatively high speed, and may implement the processes of preheating, mashing, cooking and delayed cooking, being fully automatic. The base 100 according to the embodiment of the present disclosure may be applied to more types of food processors 200 to fit more needs, and has greater practicability.

The food processor 200 according to an embodiment of the present disclosure will be described in detail below with reference to the accompanying drawings. It is worth understanding that the following description is merely exemplary, and cannot be understood as a limitation to the disclosure.

As shown in FIGS. 8 and 9, the food processor 200 includes the processing container 210 and the base 100.

The processing container 210 is provided therein with the food processing member, and the base 100 includes the housing 10, the power assembly 20, the coupler 30, the power supply board assembly 40, the capacitive component 50, the display assembly 60, the air guide duct 70, and the air guide bottom plate 71.

The power assembly 20 is provided in the middle of the mounting cavity 101 of the housing 10 and is located below the processing container 210, the coupler 30 is provided at the upper end of the rear side of the housing 10, and the display device 60 is provided at the housing 10 and is located at the front side of the processing container 210 in the horizontal direction, the power supply board assembly 40 is provided at the front side of the power assembly 20 below the display assembly 60, the capacitive component 50 is provided at the rear side of the power assembly 20 below the coupler 30, the air guide duct 70 is fitted over the power assembly 20, and the air guide bottom plate 71 is provided below the power assembly 20.

In addition, the power supply board assembly 40 is electrically connected with the power assembly 20, the coupler 30, the capacitive component 50, and the display assembly 60 respectively, and the electric connection and signal connection between the processing container 210 and the base 100 are implemented with the coupler 30.

During the assembly process, the processing container 210, the housing 10, the power assembly 20, the coupler 30, the power supply board device 40, the capacitive component 50, the display assembly 60, the air guide duct 70, and the air guide bottom plate 71 of the food processor 200 may be partitioned and modularized to be mounted, and the food processor 200 is assembled more conveniently and rapidly, and the layout of the components of the food processor 200 is reasonable, which greatly improves the safety of the whole machine.

What is claimed is:

1. A base for a food processor, a processing container of the food processor being adapted to be detachably disposed at the base, and the base comprising:
    a housing having a mounting cavity defined therein;
    a power assembly provided in the mounting cavity and being in transmission connection with a knife assembly extending into the processing container when the processing container is provided at the base, to drive the knife assembly to rotate relative to the processing container;
    a coupler mounted at an upper portion of the housing, located behind and above the power assembly, and coupled with the processing container when the processing container is placed at the base; and
    a power supply board assembly, the power supply board assembly being provided in the mounting cavity, electrically connected with the power assembly, and staggered with the coupler in a horizontal direction;
    wherein the power supply board assembly comprises a mounting bracket, a power supply board and a filter board, the power supply board and the filter board are mounted at two opposite sides of the mounting bracket respectively, and the power supply board and the filter board are electrically connected with an electric wire;
    wherein the power assembly comprises an electric motor, and a stator core of the electric motor comprises:
    a ring-shaped stator yoke having a width of W; and
    a plurality of stator teeth provided at an inner peripheral face of a stator yoke, two adjacent stator teeth defining a stator slot therebetween, the plurality of the stator teeth defining a stator hole coaxial with the stator yoke, and each of the stator teeth comprises a stator tooth body connected to the stator yoke and a stator tooth shoe provided at an inner end of the stator tooth body, and a width of each of the stator tooth bodies is V, wherein W:V=0.6-0.7.

2. The base according to claim 1, further comprising:
    a capacitive component provided in the mounting cavity and remote from the power supply board assembly, wherein the capacitive component and the power supply board assembly are provided at two sides of the power assembly respectively wherein a vertical projection of the power supply board assembly does not overlap a vertical projection of the coupler.

3. The base according to claim 1, wherein the base is provided with a display assembly configured to display an operating state of the food processor, and the power supply board assembly is electrically connected with the display assembly and is provided below the display assembly, wherein the display assembly is provided at a front side of the base.

4. The base according to claim 1, wherein the power assembly comprises the electric motor and a fan wheel provided at a lower portion of the electric motor.

5. The base according to claim 1, wherein the power assembly comprises the electric motor, and the stator core of the electric motor comprises:
    the ring-shaped stator yoke; and
    the plurality of stator teeth provided at the inner peripheral face of the stator yoke; the two adjacent stator teeth defining the stator slot therebetween, the plurality of the stator teeth defining the stator hole coaxial with the stator yoke; a rotor core being rotatably provided in the stator hole and coaxial with the stator hole, the rotor core having a maximum radial dimension d, the stator yoke having a maximum radial dimension D; wherein $0.4 \leq d/DS \leq 0.55$.

6. The base according to claim 1, wherein the power assembly comprises the electric motor, and the electric motor is a variable frequency brushless electric motor.

* * * * *